US012635067B2

(12) United States Patent
Son et al.

(10) Patent No.: US 12,635,067 B2
(45) Date of Patent: May 19, 2026

(54) CIRCUIT BOARD

(71) Applicant: LG INNOTEK CO., LTD., Seoul (KR)

(72) Inventors: Young Joon Son, Seoul (KR); Han Phil Rhyu, Seoul (KR); Dong Uk Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 381 days.

(21) Appl. No.: 18/029,005

(22) PCT Filed: Sep. 28, 2021

(86) PCT No.: PCT/KR2021/013241
§ 371 (c)(1),
(2) Date: Mar. 28, 2023

(87) PCT Pub. No.: WO2022/065984
PCT Pub. Date: Mar. 31, 2022

(65) Prior Publication Data
US 2023/0291091 A1 Sep. 14, 2023

(30) Foreign Application Priority Data
Sep. 28, 2020 (KR) ........................ 10-2020-0125829

(51) Int. Cl.
*H05K 1/02* (2006.01)
*H01Q 1/22* (2006.01)
*H05K 1/03* (2006.01)

(52) U.S. Cl.
CPC .............. *H05K 1/024* (2013.01); *H01Q 1/22* (2013.01); *H05K 1/0298* (2013.01); *H05K*

*1/0353* (2013.01); *H05K 2201/0187* (2013.01); *H05K 2201/0191* (2013.01)

(58) Field of Classification Search
CPC  H01Q 1/22; H01Q 1/243; H01Q 1/38; H05K 1/024; H05K 1/0298; H05K 1/0353; H05K 2201/0187; H05K 2201/0191; H05K 2201/09236; H05K 2201/10098; H05K 1/0277
See application file for complete search history.

(56) References Cited

U.S. PATENT DOCUMENTS

| | | | |
|---|---|---|---|
| 5,298,114 A | 3/1994 | Takeshita | |
| 6,110,568 A | 8/2000 | Takeshita | |
| 6,509,528 B1 | 1/2003 | Mori et al. | |

(Continued)

FOREIGN PATENT DOCUMENTS

| | | | |
|---|---|---|---|
| CN | 103201844 A | 7/2013 | |
| CN | 103915446 A | 7/2014 | |

(Continued)

*Primary Examiner* — Steven T Sawyer
(74) *Attorney, Agent, or Firm* — Birch, Stewart, Kolasch & Birch, LLP

(57) ABSTRACT

An antenna substrate according to the embodiment includes a substrate; an antenna pattern layer on the substrate; a first insulating layer including a resin and an inorganic filler on the substrate and the antenna pattern layer; and a second insulating layer including a resin and an inorganic filler on the first insulating layer, and wherein the second insulating layer has a higher dielectric constant and thickness than the first insulating layer.

15 Claims, 6 Drawing Sheets

(56)                     References Cited

U.S. PATENT DOCUMENTS

| | | | |
|---|---|---|---|
| 6,943,736 B2 | 9/2005 | Noro et al. | |
| 8,890,239 B2 | 11/2014 | Yaegashi et al. | |
| 9,287,299 B2 | 3/2016 | Kim et al. | |
| 10,143,086 B2 | 11/2018 | Rogers et al. | |
| 10,154,592 B2 | 12/2018 | Rogers et al. | |
| 10,327,327 B2 | 6/2019 | Yamauchi et al. | |
| 2006/0262030 A1 | 11/2006 | Bae et al. | |
| 2011/0304520 A1 | 12/2011 | Djordjevic et al. | |
| 2014/0145883 A1* | 5/2014 | Baks | H01L 23/66 |
| | | | 343/700 MS |
| 2014/0305900 A1 | 10/2014 | Rogers et al. | |
| 2016/0020165 A1* | 1/2016 | Kamgaing | H01L 21/486 |
| | | | 257/532 |
| 2017/0164482 A1 | 6/2017 | Rogers et al. | |
| 2019/0045623 A1 | 2/2019 | Sutono et al. | |
| 2019/0089044 A1* | 3/2019 | Kobuke | H01L 21/4807 |
| 2020/0006853 A1 | 1/2020 | Park et al. | |
| 2020/0313279 A1* | 10/2020 | Kim | H01Q 21/08 |
| 2020/0328518 A1* | 10/2020 | Park | H01Q 21/065 |
| 2020/0335869 A1* | 10/2020 | Jia | H01Q 9/0457 |
| 2021/0175609 A1* | 6/2021 | Ryoo | H01Q 9/42 |

FOREIGN PATENT DOCUMENTS

| | | |
|---|---|---|
| CN | 107801294 A | 3/2018 |
| JP | 4-255292 A | 9/1992 |
| JP | 2001-92936 A | 4/2001 |
| JP | 2001-119111 A | 4/2001 |
| JP | 2005-12375 A | 1/2005 |
| JP | 2005-236873 A | 9/2005 |
| JP | 2016-527701 A | 9/2016 |
| KR | 10-2006-0115530 A | 11/2006 |
| KR | 10-2014-0002542 A | 1/2014 |
| KR | 10-2017-0041020 A | 4/2017 |
| KR | 10-2019-0019804 A | 2/2019 |
| KR | 10-2020-0003509 A | 1/2020 |

* cited by examiner

【FIG. 1】
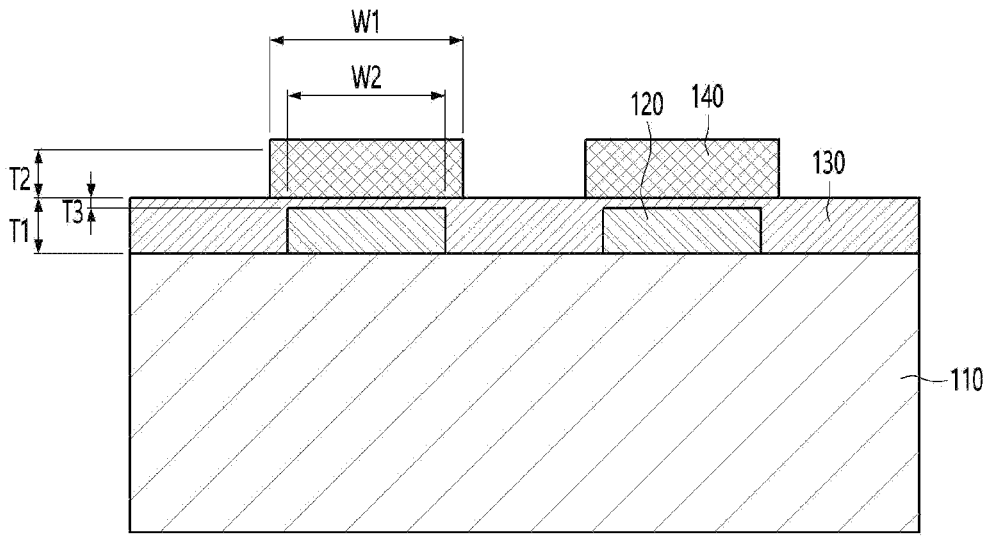
【FIG. 2】
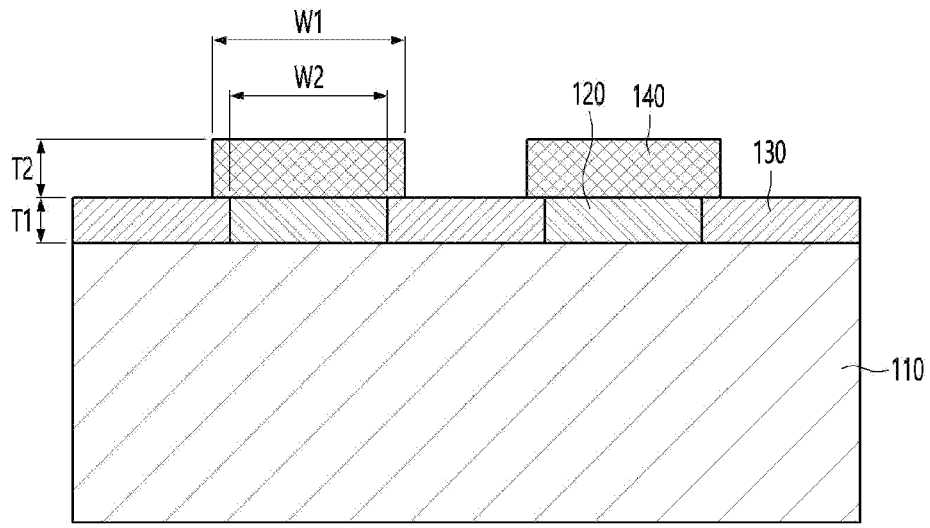

【FIG. 3】
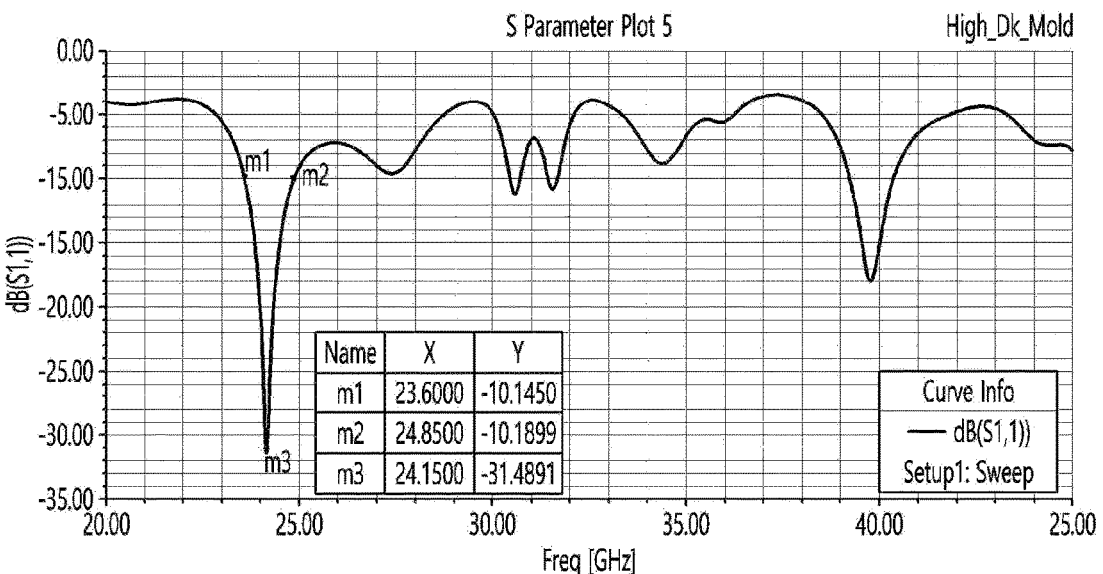

【FIG. 4】
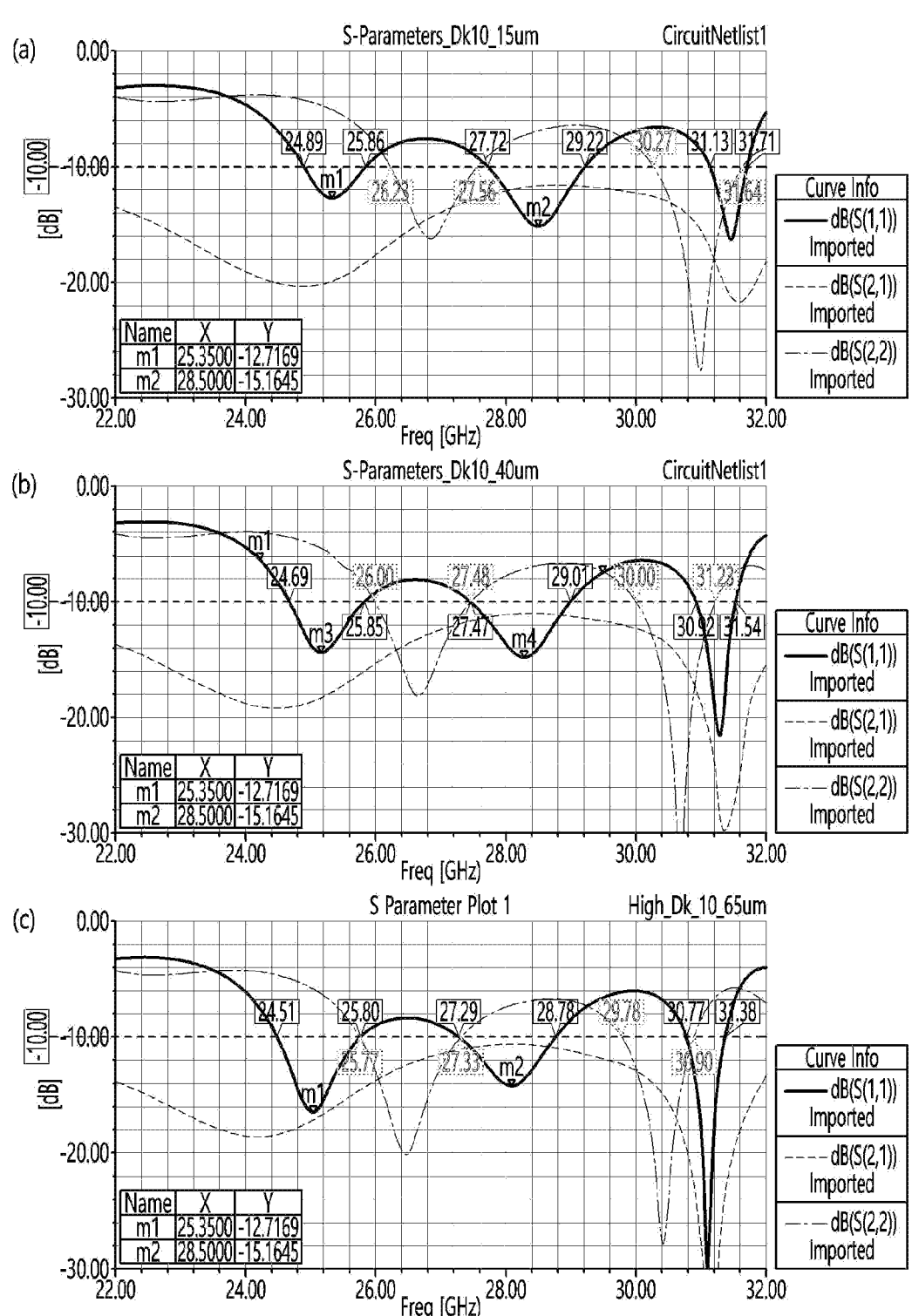

【FIG. 5】
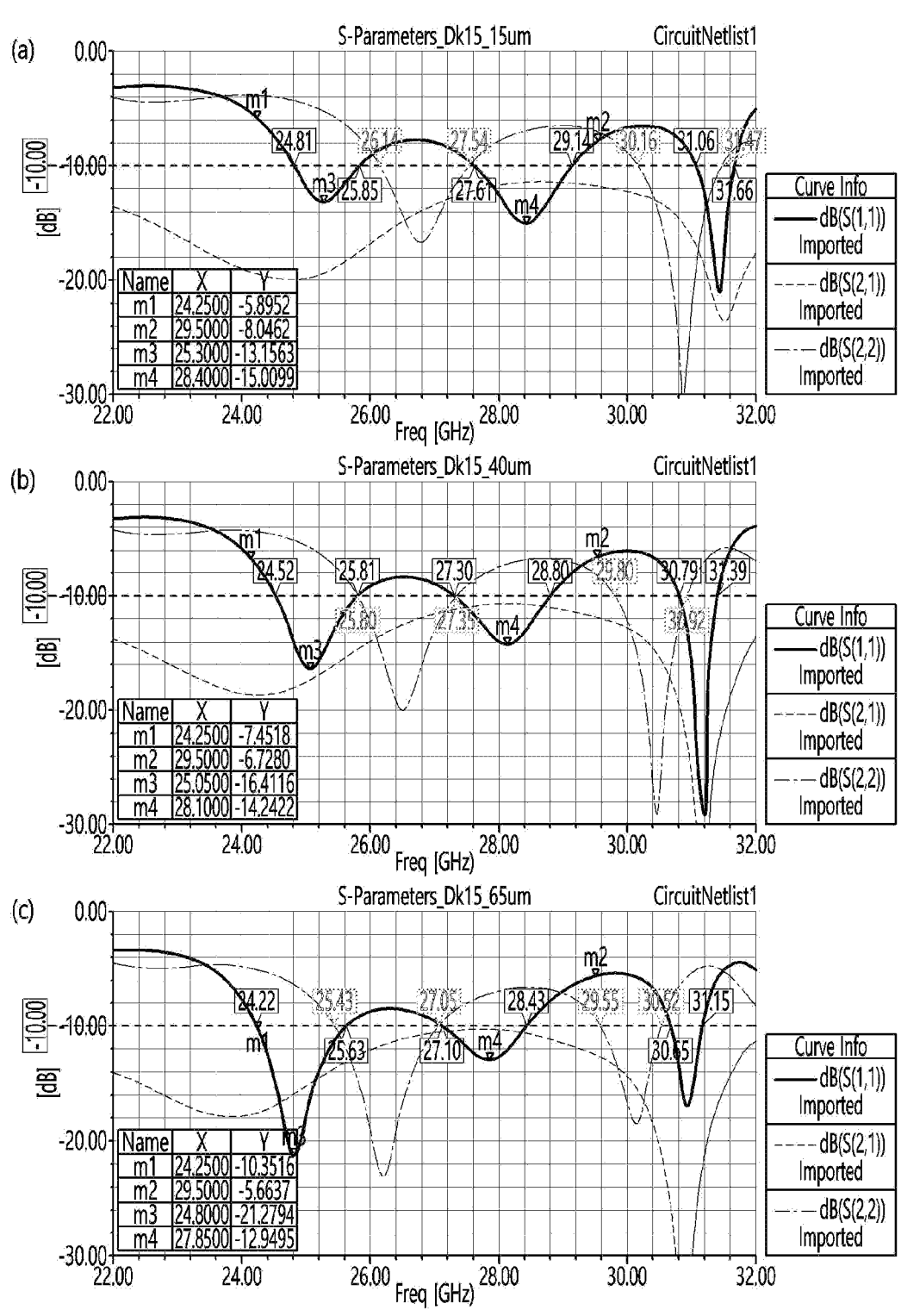

【FIG. 6】
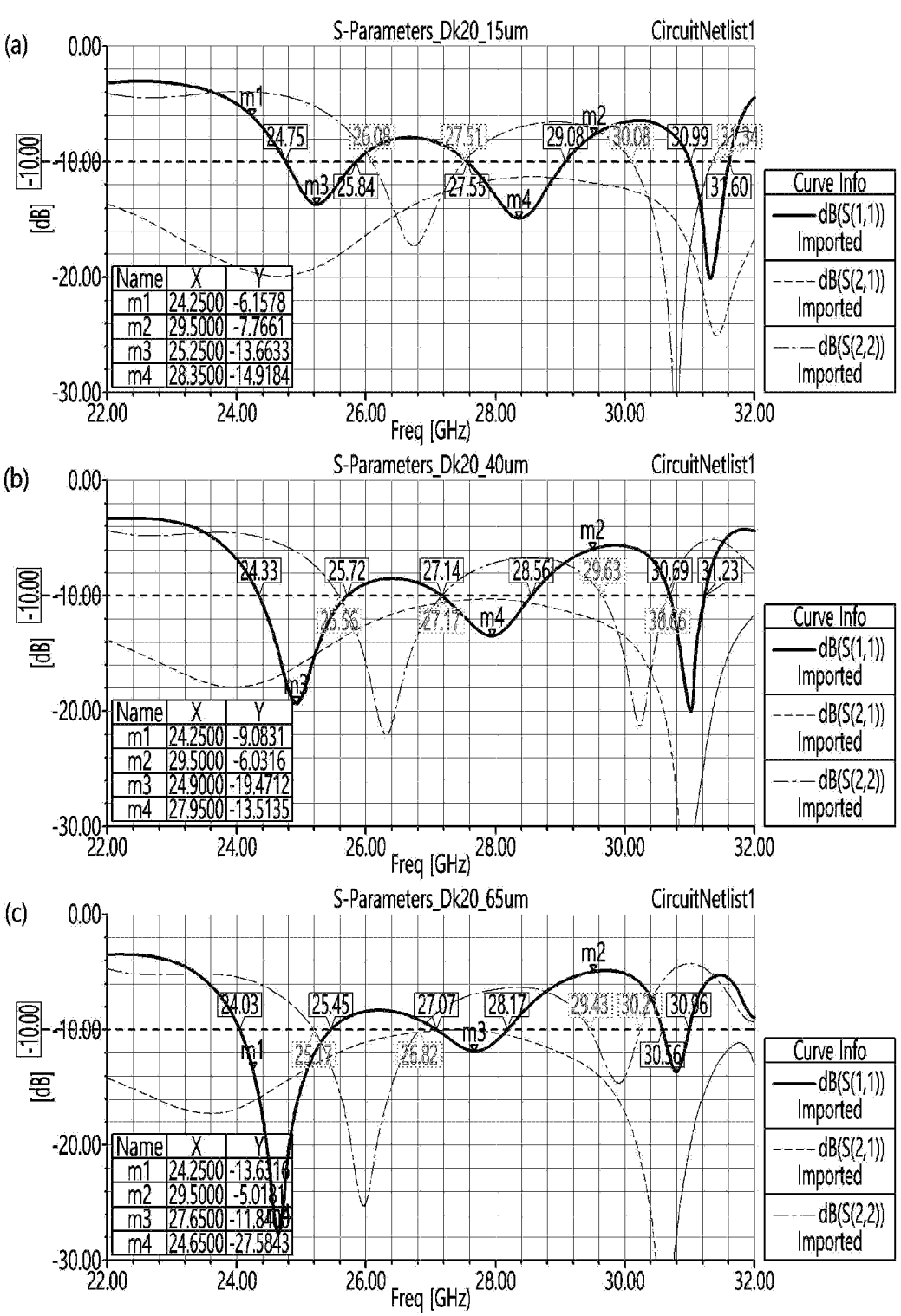

【FIG. 7】
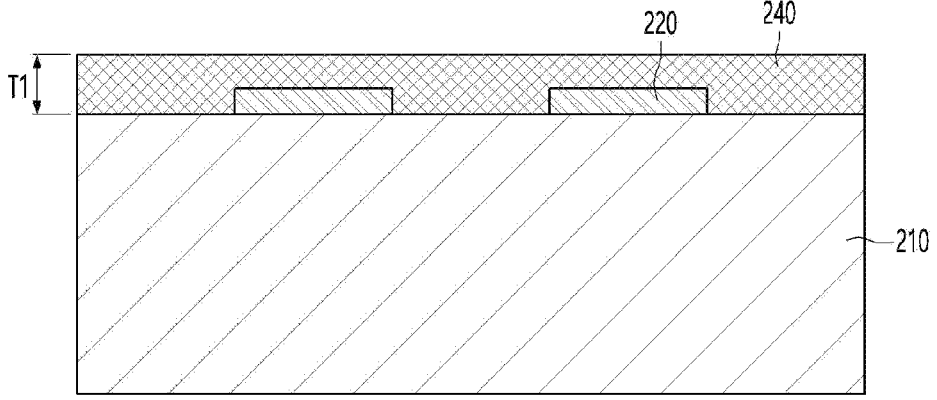
【FIG. 8】
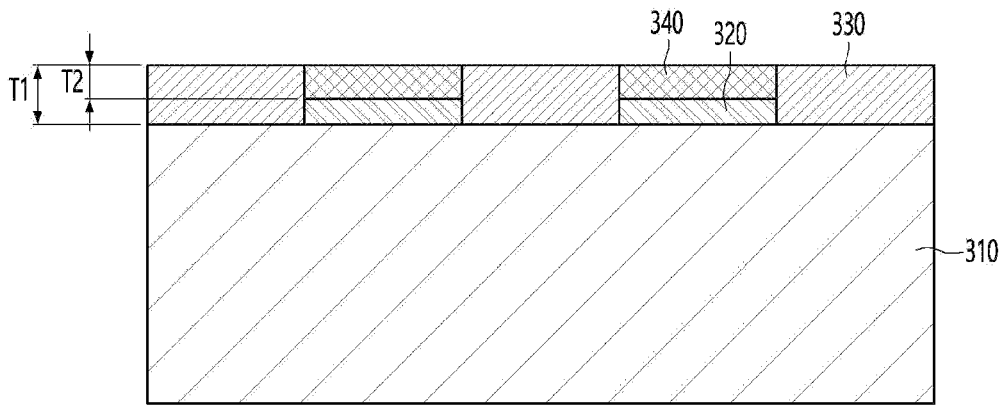

CIRCUIT BOARD

CROSS REFERENCE TO RELATED APPLICATIONS

This application is the National Phase of PCT International Application No. PCT/KR2021/013241, filed on Sep. 28, 2021, which claims priority under 35 U.S.C. § 119(a) to Patent Application No. 10-2020-0125829, filed in the Republic of Korea on Sep. 28, 2020, all of which are hereby expressly incorporated by reference into the present application.

TECHNICAL FIELD

An embodiment relates to an antenna substrate.

BACKGROUND ART

Recently, efforts have been made to develop an improved 5G (5th generation) communication system or a pre-5G communication system in order to meet a demand for wireless data traffic.

A 5G communication system uses ultra-high frequency (mm-Wave) band (sub 6 GHz, 28 GHz, 38 GHz, or higher frequencies) to achieve high data transfer rates.

Integration technologies such as beamforming, massive MIMO, and array antennas are being developed in the 5G communication system, and so that mitigate a path loss of radio waves and increase a transmission distance of radio waves in the ultra-high frequency band.

It should be taken into account that the antenna system can consist of hundreds of active antennas of wavelengths in these frequency bands, so it can be relatively large.

This means that several substrates constituting an active antenna system, that is, an antenna substrate, an antenna feed substrate, a transceiver substrate, and a baseband substrate must be integrated into one compact unit.

Meanwhile, recently, a technique for forming a resonant frequency of an antenna using a dielectric layer having a high dielectric constant has been developed. Conventionally, a high dielectric constant epoxy mold compound (EMC) or a high dielectric constant prepreg is used to form a resonance frequency.

However, a structure using a conventional epoxy mold compound forms a dielectric layer (EMC layer) for forming a resonance frequency using a mold process, and accordingly, there is a problem in that an overall thickness of the antenna module becomes thick. For example, since the EMC layer is formed by a mold process, it has a thickness of 300 μm or more, thereby increasing the overall thickness of the antenna module. In addition, when the EMC layer is formed using a mold process, there is a problem in that the mold resin flows out of the mold due to the characteristics of the manufacturing process, and thus the yield is declined.

In addition, a structure using prepreg with a high dielectric constant forms at least one layer of a plurality of insulating layers with a prepreg having a high dielectric constant during a lamination process of the substrate. In addition, when at least one insulating layer among the plurality of insulating layers is formed of a prepreg having a high dielectric constant during the lamination process of the substrate, there is a problem in that a substrate warpage problem occurs due to a difference in dielectric constant between a prepreg having a high dielectric constant and another insulating layer. In addition, the antenna substrate is manufactured including a prepreg with a high dielectric constant, static electricity and OUT-GAS harmful to the product are generated, and accordingly, it has a problem of reducing yield due to void and reliability problems.

DISCLOSURE

Technical Problem

The embodiment provides an antenna substrate with a novel structure.

In addition, the embodiment provides an antenna substrate capable of shifting a resonant frequency while providing a thin substrate.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

An antenna substrate according to the embodiment includes a substrate; an antenna pattern layer on the substrate; a first insulating layer including a resin and an inorganic filler on the substrate and the antenna pattern layer; and a second insulating layer including a resin and an inorganic filler on the first insulating layer, and wherein the second insulating layer has a higher dielectric constant and thickness than the first insulating layer.

In addition, the conductive antenna pattern layer includes a plurality of antenna patterns spaced apart from each other, and the first insulating layer entirely covers between the plurality of antenna patterns.

In addition, the second insulating layer has a dielectric constant 3 to 6 times a dielectric constant of the first insulating layer.

In addition, the second insulating layer is 1.5 to 5 times a thickness of the first insulating layer.

In addition, a thickness of the conductive antenna pattern layer is smaller than a thicknesses of each of the first insulating layer and the second insulating layer.

In addition, materials of the first insulating layer and the second insulating layer are different from each other.

In addition, the conductive antenna pattern layer is a dual resonance antenna pattern resonating in different frequency bands.

In addition, the conductive antenna pattern layer resonates in a first frequency band of 24.03 GHz to 25.81 GHz and a second frequency band of 27.07 GHz to 28.80 GHz, respectively.

In addition, a thickness of the second insulating layer is 25 μm to 65 μm.

In addition, a thickness of the first insulating layer is 10 μm to 20 μm.

In addition, the second insulating layer includes at least one from the group consisting of $TiO_2$, $Al_2O_3$, $BaTiO_3$ and $CaTiO_3$.

In addition, the first insulating layer is $SiO_2$.

In addition, the second insulating layer is formed in a predetermined pattern at regular intervals on the conductive antenna pattern layer.

In addition, the second insulating layer has a dielectric constant (Dk) of 15 to 20.

In addition, the first insulating layer has a dielectric constant (Dk) of 3 to 5.

In addition, a thickness of the first insulating layer is a thickness between a plurality of conductive antenna pattern layers.

In addition, a thickness of the first insulating layer and the second insulating layer is a thickness of a thickest portion.

Advantageous Effects

In an embodiment, an insulating layer (for example, a solder resist layer) having a high dielectric constant is disposed on the conductive antenna pattern layer, and accordingly, a resonant frequency band of the conductive antenna pattern layer is shifted using the insulating layer. Accordingly, the embodiment can drastically reduce a thickness of an antenna substrate compared to a comparative example using an epoxy mold compound by shifting the resonant frequency band using the insulating layer, and furthermore, the yield can be increased by solving the reliability problem caused by the mold process. In addition, the embodiment can solve the reliability problem due to out-gas generation compared to the comparative example using a high dielectric constant prepreg, and can lower the unit cost of the product by removing the high dielectric constant prepreg with high unit price.

DESCRIPTION OF DRAWINGS

FIG. 1 is a view showing an antenna substrate according to a first embodiment.

FIG. 2 is a view showing a modified example of an antenna substrate of a first embodiment.

FIG. 3 is a view showing resonance frequency characteristics in a conventional antenna substrate.

FIG. 4 is a view showing resonance frequency characteristics according to a change in height of a second insulating layer having a first dielectric constant according to an embodiment.

FIG. 5 is a view showing resonance frequency characteristics according to a change in height of a second insulating layer having a second dielectric constant according to an embodiment.

FIG. 6 is a view showing resonance frequency characteristics according to a change in height of a second insulating layer having a third dielectric constant according to an embodiment.

FIG. 7 is a view showing an antenna substrate according to a second embodiment.

FIG. 8 is a view showing an antenna substrate according to a third embodiment.

BEST MODE

Commonly used terms are may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

In addition, in describing the elements of the embodiments of the present invention, the terms such as first, second, A, B, (a), and (b) may be used. These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. In addition, when expressed as "on (over)" or "under (below)", it may include not only the upper direction but also the lower direction based on one element.

FIG. 1 is a view showing an antenna substrate according to a first embodiment, and FIG. 2 is a view showing a modified example of an antenna substrate according to a first embodiment.

Referring to FIG. 1, the antenna substrate includes a substrate 110, a conductive antenna pattern layer 120, a first insulating layer 130 and a second insulating layer 140.

The first insulating layer 130 and the second insulating layer 140 may be, for example, an insulating layer. That is, the first insulating layer 130 and the second insulating layer 140 may be disposed on an outermost surface of the substrate, and thus may be a protective layer functioning to protect the conductive antenna pattern layer 120.

The substrate 110 may be provided for feeding and supporting the antenna substrate. The substrate 110 may be a printed circuit board (PCB). Such, the substrate 110 has a flat structure. The substrate 110 may be composed of a single layer, or may be implemented by stacking multiple layers. The substrate 110 may include a ground layer (not shown) for grounding and a power supply unit (not shown) for power supply.

A conductive antenna pattern layer 120 may be formed on one surface of the substrate 110. The conductive antenna pattern layer 120 may be provided for signal transmission and reception on the antenna substrate. The conductive antenna pattern layer 120 may transmit and receive signals in a predetermined resonant frequency band. For example, the conductive antenna pattern layer 120 may transmit and receive electromagnetic waves by operating in a resonant frequency band. The conductive antenna pattern layer 120 may operate as power is supplied from a power supply unit (not shown) of the substrate 110.

The conductive antenna pattern layer 120 may resonate in a plurality of resonant frequency bands. For example, the conductive antenna pattern layer 120 may be a dual resonance antenna that resonates in different resonance frequency bands. For example, the conductive antenna pattern layer 120 may be a dual resonance antenna resonating in a first frequency band of 24.03 GHz to 25.81 GHz and a second frequency band of 27.07 GHz to 28.80 GHz, respectively.

Meanwhile, it is not shown in the drawings, but, the conductive antenna pattern layer 120 may also be formed in the substrate 110. That is, the conductive antenna pattern layer 120 may be formed in the substrate 110 to have a multilayer structure. The conductive antenna pattern layer 120 in the drawing may be a pattern disposed on an outermost side of the substrate 110. That is, the conductive antenna pattern layer 120 may have a multi-layer structure, or may have a single-layer structure. A number of layers of the conductive antenna pattern layer 120 may be determined based on a resonance frequency band. In the embodiment, the conductive antenna pattern layer 120 disposed on an outermost surface of the substrate 110 will be mainly described. The conductive antenna pattern layer 120 may be formed on one surface of the substrate 110 to have a thickness of 10 μm to 15 μm. For example, the conductive antenna pattern layer 120 may be formed on one surface of the substrate 110 to have a thickness of 12 μm.

A plurality of insulating layers (eg, solder resist layers) may be formed on the substrate 110.

Specifically, the plurality of insulating layers include a first insulating layer 130 formed on the substrate 110 and the conductive antenna pattern layer 120, and a second insulating layer 140 disposed on the first insulating layer 130. The first insulating layer 130 may entirely cover between the conductive antenna pattern layers 120 formed on one surface of the substrate 110. For example, the conductive antenna pattern layer 120 includes a plurality of antenna patterns spaced apart from each other. In addition, the first insulating layer 130 may be formed to entirely cover between the plurality of antenna patterns spaced apart from each other. In addition, the second insulating layer 140 may be disposed on the first insulating layer 130 or the conductive antenna pattern layer 120 at regular intervals. That is, the first insulating layer 130 is formed on a region overlapping the conductive antenna pattern layer 120 in a vertical direction. In this case, the conductive antenna pattern layer 120 includes a plurality of antenna patterns spaced apart from each other on the substrate 110. Accordingly, the second insulating layer 140 may be formed in a predetermined pattern at regular intervals on the first insulating layer 130 or the conductive antenna pattern layer 120 to correspond to the conductive antenna pattern layer 120.

The first insulating layer 130 and the second insulating layer 140 may have different areas. For example, an area of the first insulating layer 130 may be larger than that of the second insulating layer 140. Accordingly, the second insulating layer 140 may not be formed on at least a part of an upper surface of the first insulating layer 130. For example, the second insulating layer 140 may be selectively disposed only in a region overlapping the conductive antenna pattern layer 120 in a vertical direction on the upper surface of the first insulating layer 130.

A width W1 of the second insulating layer 140 may be greater than a width W2 of the conductive antenna pattern layer 120. Accordingly, the second insulating layer 140 may include a first portion overlapping the conductive antenna pattern layer 120 in the vertical direction and a second portion other than the first portion not overlapping the conductive antenna pattern layer 120. However, the embodiment is not limited thereto, and an entire region of the second insulating layer 140 may overlap the conductive antenna pattern layer 120 in the vertical direction while having the same width as the width of the conductive antenna pattern layer 120.

The first insulating layer 130 may be formed on the substrate 110 to have a first thickness T1. In addition, the second insulating layer 140 may be formed on the first insulating layer 130 to have a second thickness T2 greater than the first thickness T1. For example, the second thickness T2 of the second insulating layer 140 may be 1.5 to 5 times the first thickness T1 of the first insulating layer 130. When the second thickness T2 is smaller than 1.5 times the first thickness T1, a frequency shift effect for forming a resonant frequency band may be insignificant. When the second thickness T2 is smaller than 1.5 times the first thickness T1, a problem may occur in that the resonant frequency band of the conductive antenna pattern layer 120 does not shift to a target frequency band. When the second thickness T2 is greater than 5 times the first thickness T1, an overall thickness of the antenna substrate may increase as the thickness of the second insulating layer 140 increases. When the second thickness T2 is smaller than 5 times the first thickness T1, the resonant frequency band of the conductive antenna pattern layer 120 may deviate from a desired target frequency band.

For this purpose, the first thickness T1 of the first insulating layer 130 may be 10 μm to 20 μm. In addition, the second thickness T2 of the second insulating layer 140 may be 25 μm to 65 μm. Here, as described above, the conductive antenna pattern layer 120 may have a thickness of 10 μm to 15 μm. Accordingly, the first thickness T1 of the first insulating layer 130 may be greater than the thickness of the conductive antenna pattern layer 120. Here, the first thickness T1 of the first insulating layer 130 may be the thickness between the conductive antenna pattern layers 120. Specifically, the first thickness T1 of the first insulating layer 130 may be a thickness from an upper surface of the substrate 110 to an upper surface of the first insulating layer 130. More specifically, the first thickness T1 of the first insulating layer 130 may be a thickness of a thickest portion of the entire region of the first insulating layer 130. Similarly, the second thickness T2 of the second insulating layer 140 may be a thickness of a thickest portion of an entire region of the second insulating layer 140.

In addition, when the first thickness T1 of the first insulating layer 130 is greater than the thickness of the conductive antenna pattern layer 120, the first insulating layer 130 may also be disposed on the conductive antenna pattern layer 120. For example, the first insulating layer 130 may also be formed between the second insulating layer 140 and the conductive antenna pattern layer 120. In addition, the first thickness T1 of the first insulating layer 130 may be the same as the thickness of the conductive antenna pattern layer 120 as shown in FIG. 2. In this case, the first insulating layer 130 may not be formed between the conductive antenna pattern layer 120 and the second insulating layer 140.

In other words, the first insulating layer 130 of the embodiment may be selectively formed between the conductive antenna pattern layer 120 and the second insulating layer 140. In addition, a third thickness T3 of the first insulating layer 130 between the conductive antenna pattern layer 120 and the second insulating layer 140 may be 0 μm to 3 μm. When the third thickness T3 is greater than 3 μm, the frequency shift effect by the second insulating layer 140 may be insignificant. In addition, when the third thickness T3 is greater than 3 μm, an overall thickness of the antenna substrate may increase due to the increase in the thickness of the first insulating layer 130.

Meanwhile, the thickness of the first insulating layer 130 may mean a thickness from a lower surface of the conductive antenna pattern layer 120 to an upper surface of the first insulating layer 130. For example, the thickness of the first insulating layer 130 may include a thickness of the conductive antenna pattern layer 120 and a thickness of the first insulating layer 130 on the conductive antenna pattern layer 120. In addition, a portion formed between the conductive antenna pattern layers 120 of the first insulating layer 130 may be positioned lower than the conductive antenna pattern layer 120. For example, the first insulating layer 130 may include a first region disposed on the conductive antenna pattern layer 120 and a second region disposed on the substrate 110 between the conductive antenna pattern layer

120. In addition, a thickness of the first insulating layer 130 may be a sum of the thickness of the conductive antenna pattern layer 120 and the thickness of the first region of the first insulating layer 130. In addition, the thickness of the second region of the first insulating layer 130 may be smaller than that of the conductive antenna pattern layer 120.

Meanwhile, the first insulating layer 130 and the second insulating layer 140 may have different dielectric constants. Specifically, a dielectric constant of the second insulating layer 140 may be greater than that of the first insulating layer 130. More specifically, a dielectric constant of the second insulating layer 140 may be 3 to 6 times a dielectric constant of the first insulating layer 130. When the dielectric constant of the second insulating layer 140 is less than 3 times or greater than 5 times that of the first insulating layer 130, a resonant frequency band of the conductive antenna pattern layer 120 may deviate from a target frequency band, and thus antenna performance may decrease. To this end, the first insulating layer 130 may have a dielectric constant Dk of 3 to 5. In addition, the second insulating layer 140 may have a dielectric constant Dk of 15 to 20.

To this end, the first insulating layer 130 and the second insulating layer 140 may include different materials.

That is, each of the first insulating layer 130 and the second insulating layer 140 may include a resin and an inorganic filler.

In this case, an inorganic filler constituting the first insulating layer 130 may be different from an inorganic filler constituting the second insulating layer 140. For example, a dielectric constant of a filler included in the first insulating layer 130 may be smaller than a dielectric constant of a filler included in the second insulating layer 140.

The first insulating layer 130 may include $SiO_2$.

The second insulating layer 140 includes at least one from a group consisting of $TiO_2$, $Al_2O_3$, $BaTiO_3$ and $CaTiO_3$. That is, the dielectric constant of $TiO_2$, $Al_2O_3$, $BaTiO_3$ and $CaTiO_3$ is greater than that of $SiO_2$, and accordingly, the dielectric constant of the second insulating layer 140 may be greater than that of the first insulating layer 130. For example, the second insulating layer 140 may include an inorganic material including Ti.

The first insulating layer 130 may be filled with 20 wt % to 70 wt % of $SiO_2$ in a resin.

The second insulating layer 140 may include at least one or more of $TiO_2$, $Al_2O_3$, $BaTiO_3$ and $CaTiO_3$ in a resin, and may further contain $SiO_2$.

That is, the second insulating layer 140 may include at least one selected from among $TiO_2$, $Al_2O_3$, $BaTiO_3$ and $CaTiO_3$. Alternatively, the second insulating layer 140 may further include $SiO_2$ in addition to at least one selected from among $TiO_2$, $Al_2O_3$, $BaTiO_3$ and $CaTiO_3$.

When the second insulating layer 140 includes at least one selected from the group consisting of $TiO_2$, $Al_2O_3$, $BaTiO_3$ and $CaTiO_3$, it includes at least one. At least one of $TiO_2$, $Al_2O_3$, $BaTiO_3$ and $CaTiO_3$ may be filled in the resin in an amount of 15 wt % to 45 wt %.

Alternatively, when the second insulating layer 140 includes both at least one of $TiO_2$, $Al_2O_3$, $BaTiO_3$ and $CaTiO_3$, and $SiO_2$, a combination thereof may be included in the resin in an amount of 20 wt % to 70 wt %, and here, at least one of $TiO_2$, $Al_2O_3$, $BaTiO_3$ and $CaTiO_3$ may account for 5 wt % to 45 wt %.

Also, an average size of the inorganic fillers in the first insulating layer 130 may be different from an average size of the inorganic fillers in the second insulating layer 140. For example, the average size of inorganic fillers in the first insulating layer 130 may be greater than the average size of inorganic fillers in the second insulating layer 140. For example, the average size of the inorganic filler of the first insulating layer 130 may be 4 μm or less. For example, the average size of the inorganic filler of the second insulating layer 140 may be 3 μm or less.

As described above, the embodiment allows the second insulating layer 140 to include a high dielectric constant filler including at least one of $TiO_2$, $Al_2O_3$, $BaTiO_3$ and $CaTiO_3$, and allows the dielectric constant of the second insulating layer 140 to be greater than that of the first insulating layer 130. In addition, the resonant frequency band formed by the conductive antenna pattern layer 120 can be shifted to a desired target frequency band by the second insulating layer 140 having a dielectric constant of 15 to 20 as described above.

Hereinafter, a frequency shift effect in the antenna substrate including the second insulating layer 140 according to the embodiment will be described.

FIG. 3 is a view showing resonance frequency characteristics in a conventional antenna substrate, FIG. 4 is a view showing resonance frequency characteristics according to a change in height of a second insulating layer having a first dielectric constant according to an embodiment, FIG. 5 is a view showing resonance frequency characteristics according to a change in height of a second insulating layer having a second dielectric constant according to an embodiment, and FIG. 6 is a view showing resonance frequency characteristics according to a change in height of a second insulating layer having a third dielectric constant according to an embodiment.

FIG. 3 shows resonance frequency characteristics in a state in which an epoxy mold compound is disposed on a conductive antenna pattern layer in a conventional antenna substrate. Conventionally, a resonant frequency band is shifted by forming a dielectric layer using an epoxy mold compound on the conductive antenna pattern layer. In this case, a dielectric layer using the epoxy mold compound has a dielectric constant (Dk) of about 8 and a thickness of about 300 μm. In this case, it was confirmed that the resonance frequency of the conductive antenna pattern layer had a resonance frequency of 23.60 GHz to 24.85 GHz and a peak frequency of 24.15 GHz, based on the S-parameter (scattering parameter) of −10 dB. However, when using such an epoxy mold compound, there are issues regarding an increase in thickness and a reliability problem caused by a mold process.

Alternatively, the embodiment may allow to secure the same performance as a dielectric layer using a conventional epoxy mold compound by using the second insulating layer 140 having a high dielectric constant having a thickness of 80 μm or less.

In the embodiment, the change in frequency characteristic change was examined by changing the height of the second insulating layer having a dielectric constant (Dk) of 10 to 15 μm, 40 μm, and 65 μm as shown in FIG. 4. In addition, the change in frequency characteristics was examined by changing the height of the second insulating layer having a dielectric constant (Dk) of 15 to 15 μm, 40 μm, and 65 μm as shown in FIG. 5. In addition, the change in frequency characteristics was examined by changing the height of the second insulating layer having a dielectric constant (Dk) of 20 10 to 15 μm, 40 μm, and 65 μm.

Table 1 shows changes in frequency characteristics according to the dielectric constant and height of the second insulating layer 140.

TABLE 1

| | height: 15 μm | height: 25 μm | height: 40 μm | height: 65 μm |
|---|---|---|---|---|
| Dk: 10 | 1) first resonant frequency band: 24.89~25.86 GHz (Peak Freq.: 25.35 GHz) 2) second resonant frequency band: 27.72~29.22 GHz (Peak Freq.: 28.50 GHz) | ) first resonant frequency band: 24.82~25.86 GHz (Peak Freq.: 25.28 GHz 2) second resonant frequency band: 27.64~29.14 GHz (Peak Freq.: 28.43GHz) | 1) first resonant frequency band: 24.69~25.85 GHz (Peak Freq.: 25.20 GHz) 2) second resonant frequency band: 27.47~29.01 GHz (Peak Freq.: 28.30 GHz) | 1) first resonant frequency band: 24.51~25.80 GHz (Peak Freq.: 25.05 GHz) 2) second resonant frequency band: 27.29~28.78 GHz (Peak Freq.: 28.10 GHz) |
| Dk: 15 | 1) first resonant frequency band 24.81~25.85 GHz (Peak Freq.: 25.30 GHz) 2) second resonant frequency band: 27.61~29.14 GHz (Peak Freq.: 28.40 GHz) | 1) first resonant frequency band 24.69~25.83 GHz (Peak Freq.: 25.19 GHz) 2) second resonant frequency band: 27.51~29.05 GHz (Peak Freq.: 28.29 GHz) | 1) first resonant frequency band 24.52~25.81 GHz (Peak Freq.: 25.05 GHz) 2) second resonant frequency band: 27.30~28.80 GHz (Peak Freq.: 28.10 GHz) | 1) first resonant frequency band 24.22~25.63 GHz (Peak Freq.: 24.80 GHz) 2) second resonant frequency band: 27.10~28.43 GHz (Peak Freq.: 27.85 GHz |
| Dk: 20 | 1) first resonant frequency band: 24.75~25.84 GHz (Peak Freq.: 25.25 GHz) 2) second resonant frequency band: 27.55~29.08 GHz (Peak Freq.: 28.35 GHz) | 1) first resonant frequency band: 24.46~25.76 GHz (Peak Freq.: 25.18 GHz) 2) second resonant frequency band: 27.47~29.00 GHz (Peak Freq.: 28.23 GHz) | 1) first resonant frequency band: 24.33~25.72 GHz (Peak Freq.: 24.90 GHz) 2) second resonant frequency band: 27.14~28.56 GHz (Peak Freq.: 27.95 GHz) | 1) first resonant frequency band: 24.03~25.45 GHz (Peak Freq.: 24.65 GHz) 2) second resonant frequency band: 27.07~28.17 GHz (Peak Freq.: 27.65 GHz) |

Summarizing Table 1 based on a dielectric constant, when the dielectric constant of the second insulating layer 140 is 10, it was confirmed that the peak frequency shifted downward by 150 MHz and an edge portion of the frequency band was shifted downward by about 180 to 200 MHz as a thickness of the second insulating layer increased by 25 μm.

In addition, when the dielectric constant of the second insulating layer 140 is 15, it was confirmed that the peak frequency shifted downward by 250 MHz and an edge portion of the frequency band was shifted downward by about 200 to 300 MHz as a thickness of the second insulating layer increased by 25 μm.

In addition, when the dielectric constant of the second insulating layer 140 is 20, it was confirmed that the peak frequency shifted downward by 250 to 350 MHz and an edge portion of the frequency band was shifted downward by about 300 to 400 MHz as a thickness of the second insulating layer increased by 25 μm.

In addition, when a thickness of the second insulating layer 140 is 15, it was confirmed that the peak frequency shifted downward by 50 MHz and an edge portion of the frequency band was shifted downward by 60 to 80 MHz as a dielectric constant of the second insulating layer increased by 5.

In addition, when a thickness of the second insulating layer 140 is 40, it was confirmed that the peak frequency shifted downward by 150 MHz and an edge portion of the frequency band was shifted downward by about 170 to 190 MHz as a dielectric constant of the second insulating layer increased by 5.

In addition, when a thickness of the second insulating layer 140 is 65, it was confirmed that the peak frequency shifted downward by 250 to 350 MHz and an edge portion of the frequency band was shifted downward by about 300 to 400 MHz as a dielectric constant of the second insulating layer increased by 5.

As a result, when the dielectric constant of the second insulating layer 140 of the embodiment is 15 to 20 and the thickness thereof is 25 to 60 μm, it was confirmed that there is an effect of shifting the resonant frequency band of the conductive antenna pattern layer 120, and furthermore, it was confirmed that the same performance as the conventional epoxy mold compound having a thickness of 300 μm or more can be secured.

Hereinafter, additional embodiments will be described.

FIG. 7 is a view showing an antenna substrate according to a second embodiment.

Referring to FIG. 7, the antenna substrate may include a substrate 210, a conductive antenna pattern layer 220 and an insulating layer 240. Since the substrate 210 and the conductive antenna pattern layer 220 have substantially the same structures and configurations as those of the antenna substrate in the first embodiment shown in FIG. 1, a detailed description thereof will be omitted.

The antenna substrate in the second embodiment includes an insulating layer 240. An insulating layer 240 may be disposed on the substrate 210 and the conductive antenna pattern layer 220. That is, the antenna substrate of the first embodiment includes the first insulating layer 130 and the second insulating layer 140 having different dielectric constants disposed on the substrate and the antenna pattern. In contrast, the antenna substrate of the second embodiment includes an insulating layer disposed on the substrate and the antenna pattern.

To this end, an insulating layer 240 may correspond to the second insulating layer 140 in FIG. 1. That is, a dielectric constant of the insulating layer 240 may be 15 to 20.

In this case, the insulating layer 240 may have a first thickness T1. The first thickness T1 may mean a thickness of a thickest region among an entire region of the insulating layer 240. For example, a first thickness T1 may be a thickness of the insulating layer 240 on the substrate. The first thickness T1 of the insulating layer 240 may be 40 μm to 80 μm. Accordingly, the insulating layer 240 in the embodiment may be disposed on the conductive antenna pattern layer 220 with a predetermined height.

For example, the thickness of the insulating layer 240 on the conductive antenna pattern layer 220 may be 28 μm to 68 μm. That is, when the thickness of the conductive antenna pattern layer 220 is 12 μm, the thickness of the insulating layer 240 on the conductive antenna pattern layer 220 may be 28 μm to 68 μm.

Meanwhile, the thickness of the insulating layer 240 may mean a thickness from a lower surface of the conductive antenna pattern layer 220 to an upper surface of the insulating layer 240. For example, a thickness of the insulating layer 240 may be a sum of a thickness of the conductive antenna pattern layer 220 and a thickness of the insulating layer 240 on the conductive antenna pattern layer 220. A portion of the insulating layer 240 formed between the conductive antenna pattern layers 220 may be positioned lower than the conductive antenna pattern layers 220. For example, the insulating layer 240 may include a first region disposed on the conductive antenna pattern layer 220 and a second region disposed on the substrate 210 between the conductive antenna pattern layer 220. In addition, a thickness of the insulating layer 240 may be a sum of a thickness of the conductive antenna pattern layer 220 and a thickness of the first region of the insulating layer 220. In addition, a thickness of the second region of the insulating layer 240 may be smaller than that of the conductive antenna pattern layer 220.

FIG. 8 is a view showing an antenna substrate according to a third embodiment.

Referring to FIG. 8, the antenna substrate may include a substrate 310, a conductive antenna pattern layer 320, a first insulating layer 330 and a second insulating layer 340. Since the substrate 310 and the conductive antenna pattern layer 320 have substantially the same structures and configurations as those of the antenna substrate in the first embodiment shown in FIG. 1, a detailed description thereof will be omitted.

The antenna substrate in the third embodiment includes a first insulating layer 330 and a second insulating layer 340. In this case, a material property of the first insulating layer 330 is the same as those of the first insulating layer 130 in the first embodiment. In addition, a material property of the second insulating layer 340 is the same as those of the second insulating layer 140 in the first embodiment.

The first embodiment includes a first insulating layer formed on the substrate and the conductive antenna pattern layer, and a second insulating layer formed on the first insulating layer. Accordingly, the upper surface of the first insulating layer in the first embodiment was positioned lower than the upper surface of the second insulating layer.

Alternatively, the first insulating layer 330 in the third embodiment is formed on the substrate 310 and the second insulating layer 340 is formed on the conductive antenna pattern layer 320. That is, the first insulating layer 330 is formed on the substrate 310 and has an opening (not shown) exposing a surface of the conductive antenna pattern layer 320. In addition, the second insulating layer 340 is formed on the conductive antenna pattern layer 320 exposed through the opening of the first insulating layer 330. Accordingly, a lower surface of the second insulating layer 340 may directly contact an upper surface of the conductive antenna pattern layer 320. In addition, a width of the second insulating layer 340 may be the same as that of the conductive antenna pattern layer 320. In addition, an upper surface of the second insulating layer 340 and an upper surface of the first insulating layer 330 may be positioned on the same plane. Here, the meaning of the same is interpreted including the range to which a similar function can be expected without being bound by a strict meaning.

A first thickness T1 of the first insulating layer 330 may be 40 μm to 80 μm. In addition, a second thickness T2 of the second insulating layer 340 may be 28 μm to 68 μm. That is, the conductive antenna pattern layer 320 may have a thickness of 12 μm, and thus the second thickness T2 of the second insulating layer 340 may range from 28 μm to 68 μm.

On the other hand, a material constituting the first insulating layer 330, a material constituting the second insulating layer 340, and a dielectric constant relationship between the first insulating layer 330 and the second insulating layer 340 has already been described in the first embodiment, a description thereof will be omitted.

In an embodiment, an insulating layer (for example, a solder resist layer) having a high dielectric constant is disposed on the conductive antenna pattern layer, and accordingly, a resonant frequency band of the conductive antenna pattern layer is shifted using the insulating layer. Accordingly, the embodiment can drastically reduce a thickness of an antenna substrate compared to a comparative example using an epoxy mold compound by shifting the resonant frequency band using the insulating layer, and furthermore, the yield can be increased by solving the reliability problem caused by the mold process. In addition, the embodiment can solve the reliability problem due to out-gas generation compared to the comparative example using a high dielectric constant prepreg, and can lower the unit cost of the product by removing the high dielectric constant prepreg with high unit price.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. An antenna substrate comprising:
   a substrate;
   an uppermost conductive pattern layer disposed on the substrate;
   a first solder resist layer disposed on the uppermost conductive pattern layer; and
   a second solder resist layer disposed on the first solder resist layer,
   wherein the first solder resist layer includes a material different from a material of the second solder resist layer,
   wherein the first solder resist layer includes a first region disposed on the substrate and not overlapping the uppermost conductive pattern layer in a vertical direction, and a second region disposed on the uppermost conductive pattern layer and having a thickness smaller than a thickness of the first region, wherein a thickness of the second solder resist layer is greater than the thickness of the first region of the first solder resist layer, wherein the second solder resist layer does not contact the uppermost conductive pattern layer and is spaced apart from the uppermost conductive pattern layer by the thickness of the second region in the vertical direction, wherein the uppermost conductive pattern layer includes a plurality of conductive patterns spaced apart from each other in a horizontal direction, wherein the second solder resist layer includes a plurality of insulating patterns overlapping each of the plurality of conductive patterns in the vertical direction and spaced apart from each other in the horizontal direction, and wherein a width of each of the plurality of insulating patterns in the horizontal direction is greater than a width of each of the plurality of conductive patterns in the horizontal direction.

2. The antenna substrate of claim 1, wherein a dielectric constant of the second solder resist layer is greater than a dielectric constant of the first solder resist layer.

3. The antenna substrate of claim 2, wherein the second solder resist layer has a dielectric constant of 3 to 6 times a dielectric constant of the first solder resist layer.

4. The antenna substrate of claim 1, wherein a thickness of the second solder resist layer is 1.5 to 5 times the thickness of the first solder resist layer.

5. The antenna substrate of claim 1, wherein a thickness of the uppermost conductive pattern layer is thinner than the thickness of the first solder resist layer and the second solder resist layer.

6. The antenna substrate of claim 1, wherein the uppermost conductive pattern layer is a dual resonance antenna pattern layer resonating in each of different frequency bands.

7. The antenna substrate of claim 6, wherein the uppermost conductive pattern layer resonates in each of a first frequency band of 24.03 GHz to 25.81 GHz and a second frequency band of 27.07 GHz to 28.80 GHz.

8. The antenna substrate of claim 1, wherein the second solder resist layer has a thickness of 25 $\mu$m to 65 $\mu$m.

9. The antenna substrate of claim 8, wherein the first solder resist layer has a thickness of 10 $\mu$m to 20 $\mu$m.

10. The antenna substrate of claim 1, wherein the second solder resist layer includes at least one from a group consisting of $TiO_2$, $Al_2O_3$, $BaTiO_3$ and $CaTiO_3$.

11. The antenna substrate of claim 10, wherein the second solder resist layer further includes a $SiO_2$.

12. The antenna substrate of claim 10, wherein the first solder resist layer includes a $SiO_2$.

13. The antenna substrate of claim 3, wherein the dielectric constant of the first solder resist layer satisfies a range of 3 to 5.

14. The antenna substrate of claim 3, wherein the dielectric constant of the second solder resist layer satisfies a range of 15 to 20.

15. The antenna substrate of claim 4, wherein the thickness of the first solder resist layer is a thickness of a region vertically overlapping the uppermost conductive pattern layer.

* * * * *